United States Patent
Hsieh et al.

(10) Patent No.: US 9,099,612 B2
(45) Date of Patent: Aug. 4, 2015

(54) SEMICONDUCTOR LIGHT-EMITTING DEVICE AND THE MANUFACTURING METHOD THEREOF

(75) Inventors: Min-Hsun Hsieh, Hsinchu (TW); Wei-Yu Chen, Taoyuan (TW); Li-Ming Chang, Taichung (TW); Chien-Yuan Wang, Kaohsiung (TW); Chiu-Lin Yao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 16 days.

(21) Appl. No.: 13/193,970

(22) Filed: Jul. 29, 2011

(65) Prior Publication Data
US 2012/0025250 A1 Feb. 2, 2012

(30) Foreign Application Priority Data

Jul. 30, 2010 (TW) ................. 99125582 A

(51) Int. Cl.
*H01L 33/38* (2010.01)
*H01L 33/24* (2010.01)

(52) U.S. Cl.
CPC ............ *H01L 33/382* (2013.01); *H01L 33/387* (2013.01); *H01L 33/24* (2013.01); *H01L 2933/0016* (2013.01)

(58) Field of Classification Search
CPC ..................... H01L 33/382; H01L 33/387
See application file for complete search history.

(56) References Cited

U.S. PATENT DOCUMENTS

| | | | |
|---|---|---|---|
| 8,207,539 B2 * | 6/2012 | Hsieh et al. | 257/79 |
| 2008/0237622 A1 * | 10/2008 | Choi et al. | 257/98 |
| 2009/0101923 A1 * | 4/2009 | Choi et al. | 257/89 |
| 2009/0101926 A1 * | 4/2009 | Lee | 257/94 |
| 2011/0284821 A1 * | 11/2011 | Moon et al. | 257/13 |
| 2012/0007118 A1 * | 1/2012 | Choi et al. | 257/98 |
| 2012/0018764 A1 * | 1/2012 | Choi et al. | 257/99 |
| 2012/0086026 A1 * | 4/2012 | Engl et al. | 257/93 |

FOREIGN PATENT DOCUMENTS

| | | |
|---|---|---|
| CN | 1734797 A | 2/2006 |
| CN | 101364621 A | 2/2009 |
| WO | WO 2009106069 A1 * | 9/2009 |
| WO | WO 2010056083 A2 * | 5/2010 |

* cited by examiner

*Primary Examiner* — Yu Chen
(74) *Attorney, Agent, or Firm* — Ditthavong & Steiner, P.C.

(57) ABSTRACT

This application provides a semiconductor light-emitting device and the manufacturing method thereof. The semiconductor light-emitting device comprises a semiconductor light-emitting structure and a thinned substrate. The semiconductor light-emitting structure comprises a plurality of semiconductor layers and a plurality of first channels, wherein a plurality of first channels has a predetermined depth that penetrating at least two layers of the plurality of semiconductor layers.

20 Claims, 14 Drawing Sheets

SEMICONDUCTOR LIGHT-EMITTING DEVICE AND THE MANUFACTURING METHOD THEREOF

CROSS REFERENCE TO RELATED APPLICATIONS

This application claims the right of priority based on Taiwan Patent Application No. 099125582 entitled "A SEMICONDUCTOR LIGHT-EMITTING DEVICE AND THE MANUFACTURING METHOD THEREOF", filed on Jul. 30, 2010, which is incorporated herein by reference in its entirety and assigned to the assignee herein.

TECHNICAL FIELD

The present application generally relates to a semiconductor light-emitting device and the manufacturing method thereof, and more particularly to a semiconductor light-emitting device structure comprises a plurality of semiconductor layers and a plurality of first channels, and the manufacturing method thereof.

BACKGROUND

Semiconductor light-emitting devices such as the light-emitting diode (LED) have continuous improvement in brightness recently, and the application is expanded from conventional signals or decorative use to light sources for various apparatus. Even in the coming future, it is possible for LEDs to replace the traditional fluorescent lamps as the new generational light source in the illuminating field.

Currently the internal quantum efficiency (IQE) of light-emitting diode is about 50% to 80%, and about 20% to 50% of the input power can not be transformed into light but become heat accumulated in the light-emitting diode. When the heat can not be dissipated from the light-emitting diode effectively, the heat results in the increase of the temperature in the light-emitting diode, and the reliability of the light-emitting diode is therefore decreased. In addition, when the light generated by the light-emitting diode can not be extracted effectively, part of the light is confined in the light-emitting diode due to the totally internal reflection and is reflected or refracted back and forth in the light-emitting diode, and is finally absorbed by the electrode or light-emitting layer which causes lower brightness.

SUMMARY

The present application provides a semiconductor light-emitting device comprising a thinned substrate; a semiconductor light-emitting structure on the thinned substrate, wherein the semiconductor light-emitting structure comprising a plurality of semiconductor layers and a plurality of first channels, wherein the plurality of first channels has a predetermined depth that penetrating at least two layers of the plurality of semiconductor layers.

The present application provides a semiconductor light-emitting device comprising a carrier having a first surface and a second surface; an intermediate layer on the first surface of the carrier; an insulating layer on the intermediate layer; a semiconductor light-emitting structure on the insulating layer, comprising a plurality of semiconductor layers, a plurality of first channels, and a plurality of second channels, wherein the plurality of first channels has a predetermined depth that penetrating at least two layers of the plurality of semiconductor layers, the plurality of second channels has a predetermined depth that penetrating at least two layers of the plurality of semiconductor layers and extending to the insulating layer, wherein the plurality of second channels comprising an dielectric layer and a conductive layer; and a bonding pad on the second surface of the carrier.

The present application provides a semiconductor light-emitting device comprising a carrier having a first surface and a second surface; an intermediate layer on the first surface of the carrier; an insulating layer on the intermediate layer; a semiconductor light-emitting structure on the insulating layer, comprising a plurality of semiconductor layers, a plurality of first channels, and a plurality of second channels, wherein the plurality of first channels has a predetermined depth that penetrating at least two layers of the plurality of semiconductor layers, the plurality of second channels has a predetermined depth that penetrating at least two layers of the plurality of semiconductor layers and extending to the insulating layer, wherein the plurality of second channels comprising an dielectric layer and a conductive layer; and a electricity connecting layer, wherein the electricity connecting layer electrically connected with the plurality of second channels.

In accordance with one embodiment of the present application, the plurality of first channels is formed by a laser irradiating the plurality of first channels.

In accordance with one embodiment of the present application, the plurality of second channels is formed by dry etching or wet etching.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
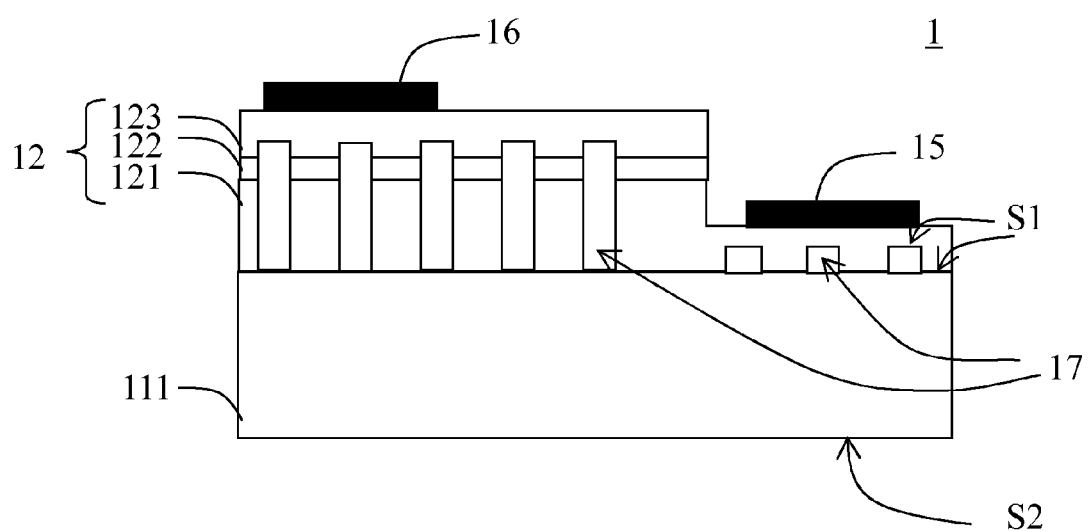
FIG. 1 illustrates a diagram of a horizontal semiconductor device structure in accordance with the first embodiment of the present application.

FIG. 1 shows the cross-sectional view of a horizontal light-emitting device 1 in accordance with an embodiment of the present application. The light-emitting device 1 comprises a thinned substrate 111 having a top surface S1 and a lower surface S2, a semiconductor light-emitting structure 12 disposed on the top surface 51 comprising a plurality of semiconductor layers and a plurality of first channels 17, wherein the plurality of semiconductor layers comprising a first conductivity type semiconductor layer 121, an active layer 122, and a second conductivity type semiconductor layer 123, wherein part of the semiconductor light-emitting structure 12 is removed to expose a portion of the first conductivity type semiconductor layer 121; a first wire pad 15 and a second wire pad 16 electrically connected to the second conductivity type semiconductor layer 123 and the first conductivity type semiconductor layer 121 respectively wherein the first wire pad 15 and the second wire pad 16 are disposed on the same side of the thinned substrate; and a plurality of first channels 17 having a predetermined depth that penetrating at least two layers of the plurality of semiconductor layers. The thinned substrate 111 is formed by thinning a growth substrate used to grow the semiconductor light-emitting structure 12 so the light-emitting device thermal resistivity is decreased. The growth substrate is thinned from the original thickness of more than 200 μm or 300 μm to a thickness no greater than 50 μm to form the thinned substrate 111 after growing the semiconductor light-emitting structure 12 on the growth substrate. The material of the growth substrate comprises GaAs, GaP, sapphire, SiC, GaN, or MN.

The plurality of first channels 17 is formed by using the laser scanning the lower surface S2 of the thinned substrate to decompose the material of semiconductor light-emitting structure 12 when absorbing the laser energy, and the decomposed material is removed by wet etching with HCl and KOH solution. The first channels 17 contain a transparent material having a refractive index different from that of the thinned substrate 111 and having a difference greater than 0.1, wherein the material can be silicon oxide, silicon nitride, organic polymer, or air, and the light extractive efficiency is therefore increased. The first channels 17 can also be filled with a high thermal conductive transparent material such as silicon carbide, zinc oxide, or diamond to decrease the thermal resistivity of the device and increase the light extractive efficiency. In one embodiment, the plurality of first channels 17 has a predetermined depth that penetrating at least two layers of the plurality of semiconductor layers 12, and is much preferable to extend to the second conductivity type semiconductor layer 123. The plurality of first channels 17 is arranged in a periodically two-dimensional order, but they can also be arranged in a quasi-periodic, varied periodic, or irregular order, such as a two-dimensional ordered arrangement formed with cylinders or polygonal columns with a diameter of about 1-10 μm, or multiple rectangular channels in a cross-linking arrangement like a mesh. The material of the first conductivity type semiconductor layer 121, the active layer 122, or the second conductivity type semiconductor layer 123 includes $Al_pGa_qIn_{(1-p-q)}P$ or $Al_xGa_yIn_{(1-x-y)}N$, wherein 0≤p, q≤1, 0≤x, y≤1 and wherein p, q, x, and y are positive, and (p+q)≤1, (x+y)≤1.

Figure 2:
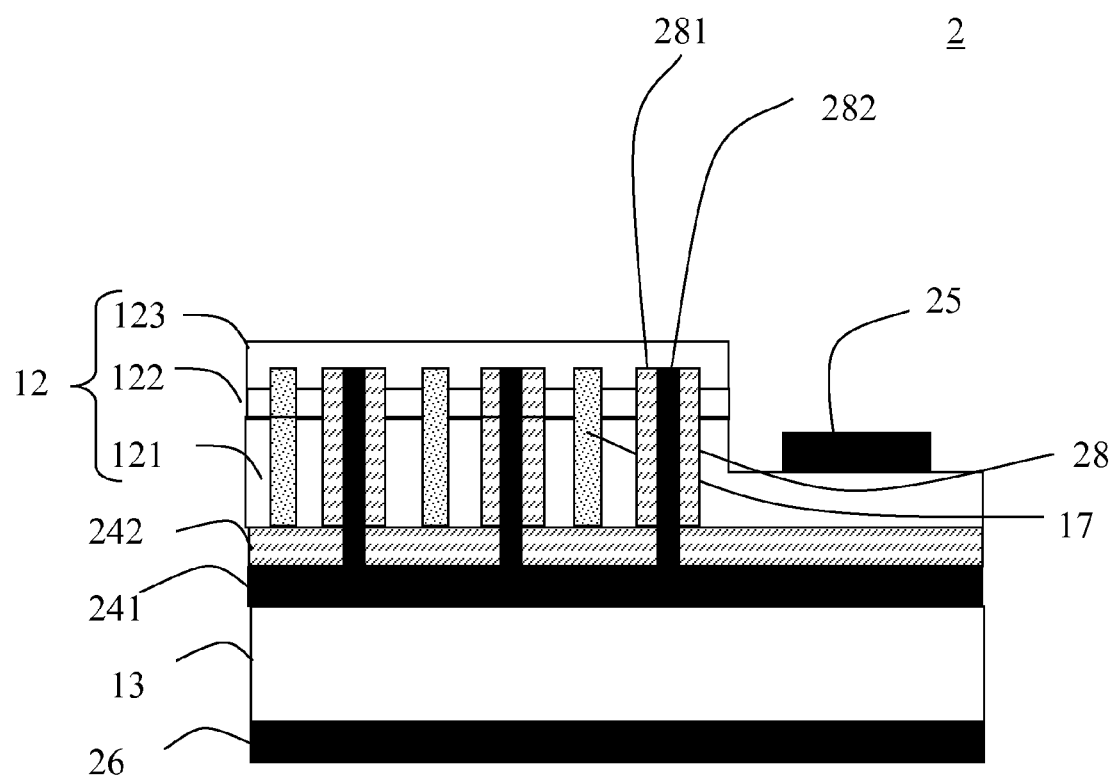
FIG. 2 illustrates a diagram of a vertical semiconductor device structure in accordance with the second embodiment of the present application.

FIG. 2 shows the cross-sectional view of a vertical light-emitting device 2 in accordance with the second embodiment of the present application. Comparing with the light-emitting device 1 illustrated in FIG. 1, the first wire pad 25 and the second wire pad 26 of the light-emitting device 2 are disposed on the opposite sides of the substrate. Comparing with the light-emitting device 1 illustrated in FIG. 1, the growth substrate is removed after the semiconductor light-emitting structure 12 is formed. The light-emitting device 2 comprises a carrier 13; an intermediate layer 241 on the carrier 13; an insulating layer 242 on the intermediate layer 241; a semiconductor light-emitting structure 12 on the insulating layer 242 comprising a plurality of semiconductor layers, a plurality of first channels, and a plurality of second channels, wherein the plurality of semiconductor layers comprises a first conductivity type semiconductor layer 121, an active layer 122, and a second conductivity type semiconductor layer 123, wherein part of the semiconductor light-emitting structure 12 is removed to expose a portion of the first conductivity type semiconductor layer 121; a first wire pad 25 on the exposed portion of the first conductivity type semiconductor layer 121; and a second wire pad 26 formed on the other side of the carrier 13; the plurality of first channels 17 has a predetermined depth that penetrating at least two layers of the plurality of semiconductor layers 12, and is much preferable to extend to the second conductivity type semiconductor layer 123; the plurality of second channels 28 has a predetermined depth that penetrating at least two layers of the plurality of semiconductor layers and extending to the insulating layer 242. The plurality of second channels 28 is formed by forming a dielectric layer 281 on the inner sidewall of the second channels 28 and forming a conductive layer 282 by filling a conductive material in the second channels; wherein the plurality of second channels is electrically connected to the second conductivity type semiconductor layer 123.

Besides, the intermediate layer 241 is a connecting layer comprising a conductive material which is the same as or different from the conductive layer 282. The material can be a metal or its alloys such as AuSn, PbSn, AuGe, AuBe, AuSi, Sn, In, Au, or PdIn. Next, an insulating layer 242 is formed between the intermediate layer 241 and the semiconductor light-emitting structure 12. The carrier 13 is a conductive material such as carbide, metal, metal alloy, metal oxide, or metal complex material, wherein the carrier 13 is beneath the intermediate layer 241 and connected such by directly connecting, metal connecting, or adhesion connecting methods, or by electroplating, evaporation, chemical plating, metal-organic chemical vapor deposition, or vapor phase epitaxy methods. The quantity and arrangement of the second channels 28 are used for a better current spreading effect, besides, the second channels 28 can transmit the heat produced by the semiconductor light-emitting structure 12 to the carrier 13 for its higher thermal conductive coefficient comparing with that of the first conductivity type semiconductor layer 121. The material of the conductive layer 282 of the second channels 28 comprises electrical conductive materials like metals, metal alloys, metal oxides, or conductive polymers.

Figure 3:
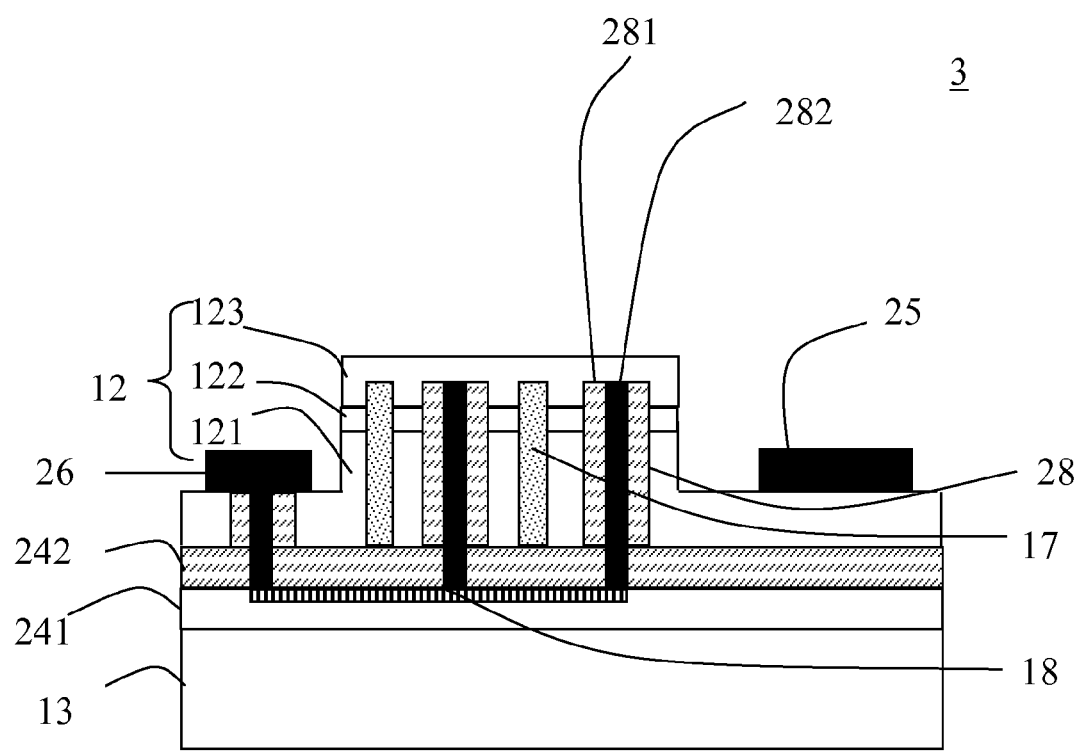
FIG. 3 illustrates a diagram of a horizontal semiconductor device structure in accordance with the third embodiment of the present application.

FIG. 3 shows the cross-sectional view of a horizontal light-emitting device 3 in accordance with the third embodiment of the present application. Comparing with the light-emitting device 2 illustrated in FIG. 2, the first wire pad 25 and the second wire pad 26 of the light-emitting device 3 are disposed on the same side of the substrate. The light-emitting device 3 comprises a carrier 13; an intermediate layer 241 on the carrier 13; an insulating layer 242 on the intermediate layer 241; a semiconductor light-emitting structure 12 on the insulating layer 242 comprising a plurality of semiconductor layers, a plurality of first channels, and a plurality of second channels, wherein the plurality of semiconductor layers comprises a first conductivity type semiconductor layer 121, an active layer 122, and a second conductivity type semiconductor layer 123, wherein part of the semiconductor light-emitting structure 12 is removed to expose a left portion and a right portion of the first conductivity type semiconductor layer 121; a first wire pad 25 on the exposed right portion of the first conductivity type semiconductor layer 121; the plurality of first channels 17 has a predetermined depth that penetrating at least two layers of the plurality of semiconductor layers 12, and is much preferable to extend to the second conductivity type semiconductor layer 123; the plurality of second channels 28 has a predetermined depth that penetrating at least two layers of the plurality of semiconductor layers and extending to the insulating layer 242. The plurality of the second channels 28 is formed by forming a dielectric layer 281 on the inner sidewall of the second channels 28 and forming a conductive layer 282 by filling a conductive material in the second channels. The conductive layers 282 in the plurality of second channels are connected by an electricity connecting layer 18 electrically connected with the second conductivity type semiconductor layer 123. The second wire pad 26 is formed on the exposed left portion of the first conductivity type semiconductor layer 121 and electrically connected with the electricity connecting layer 18.

Besides, the intermediate layer 241 is a connecting layer comprising an organic polymer material such as BCB, PFBC, Epoxy, or Silicone; a metal or its alloys such as AuSn, PbSn, AuGe, AuBe, AuSi, Sn, In, Au, or PdIn. Next, an insulating layer 242 is formed between the intermediate layer 241 and the semiconductor light-emitting structure 12. The carrier 13 is a non-conductive material such as silicide, diamond, diamond-like carbon, and so on. The carrier 13 is beneath the intermediate layer 241 and connected such by directly connecting, metal connecting, or adhesion connecting methods, or by electroplating, evaporation, chemical plating, metal-organic chemical vapor deposition, or vapor phase epitaxy methods. The material of the conductive layer 282 of the second channels 28 comprises electrical conductive materials like metals, metal alloys, metal oxides, or conductive polymers.

Figure 4:
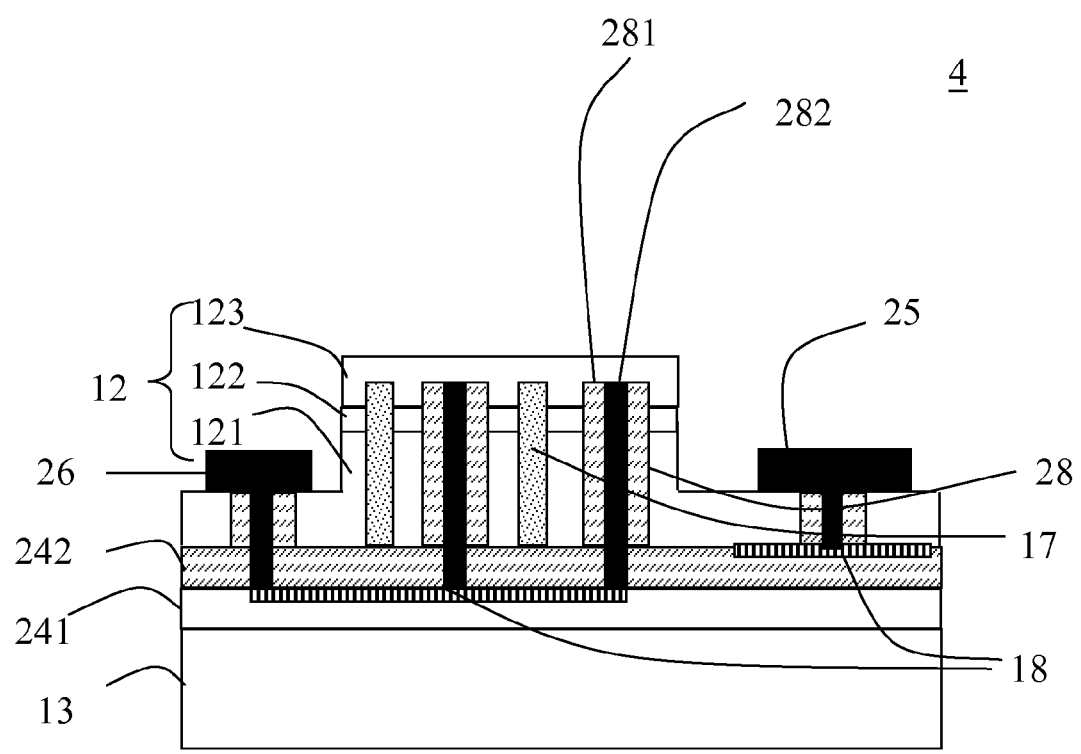
FIG. 4 illustrates a diagram of a horizontal semiconductor device structure in accordance with the fourth embodiment of the present application.

FIG. 4 shows the cross-sectional view of a horizontal light-emitting device 4 in accordance with the fourth embodiment of the present application. Comparing with the light-emitting device 3 illustrated in FIG. 3, an electricity connecting layer 18 is further formed in the insulating layer 242. The first wire pad 25 is electrically connected with the first conductivity type semiconductor layer 121 by the second channel 28 and the electricity connecting layer 18. The above mentioned design in the light-emitting device 4 has a better current spreading effect.

Figure 5A:
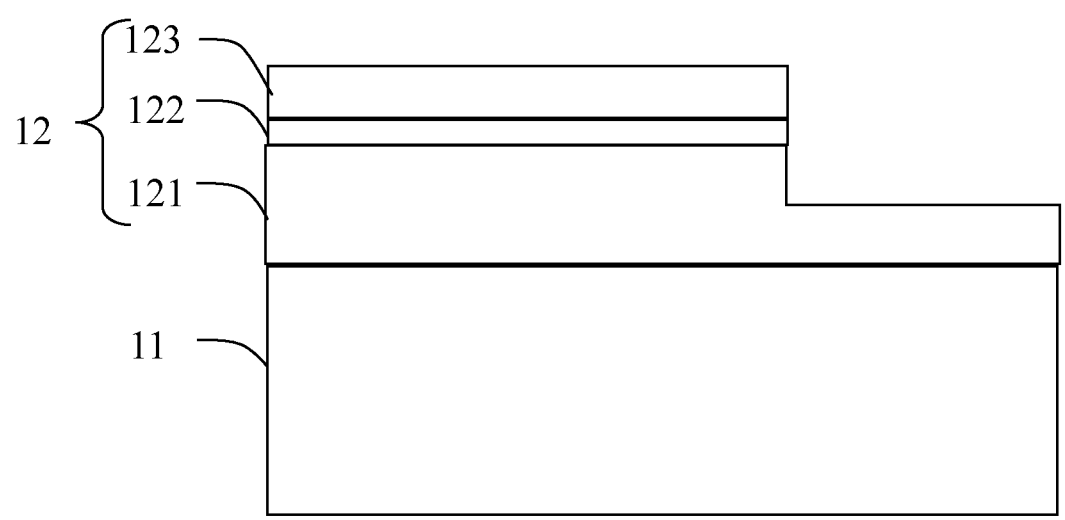
FIGS. 5A-5J illustrate diagrams of a vertical semiconductor device structure and manufacturing method in accordance with the second embodiment of the present application.
Figure 5B:
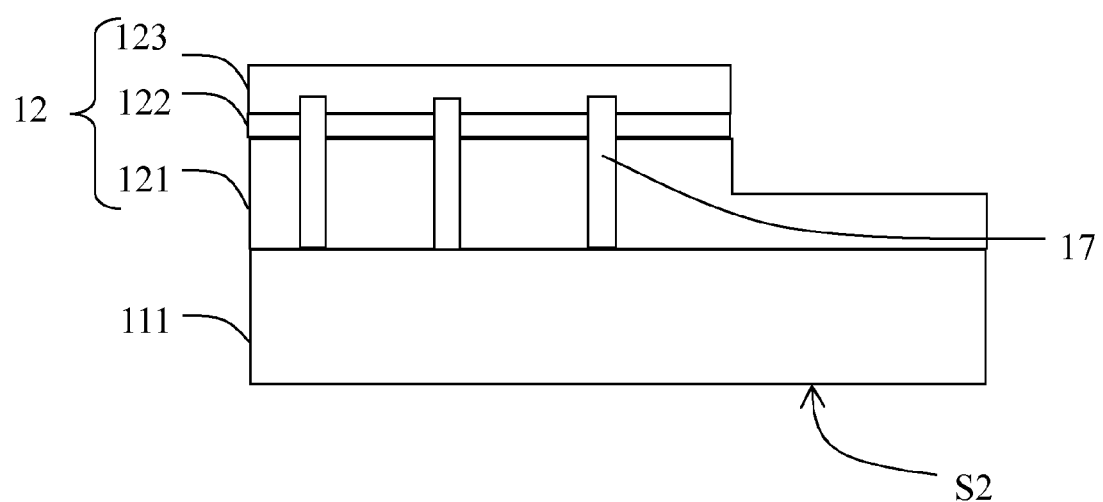
Figure 5C:
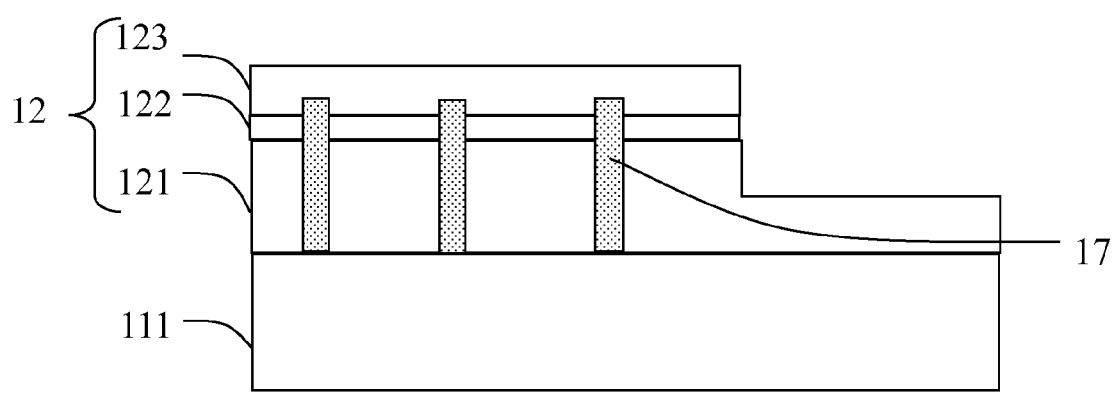
Figure 5D:
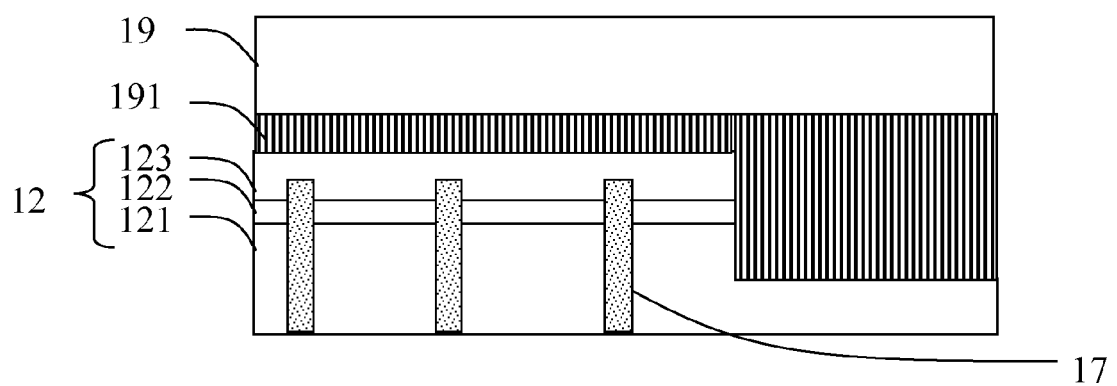
Figure 5E:
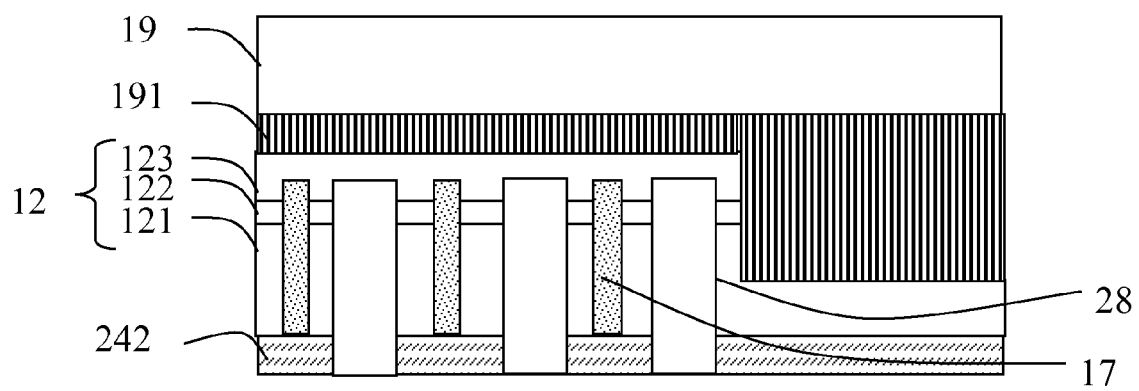
Figure 5F:
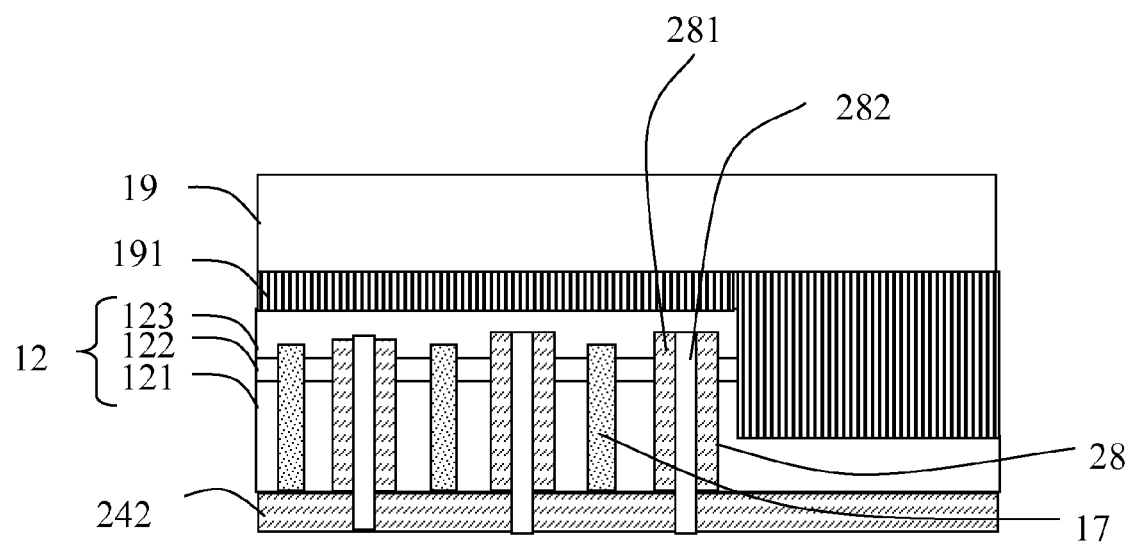
Figure 5G:
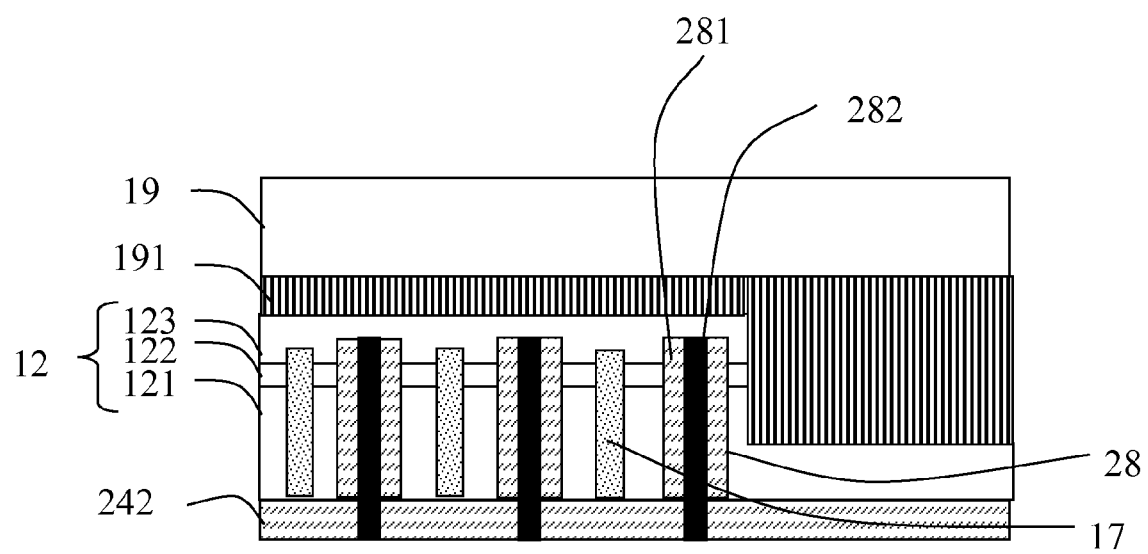
Figure 5H:
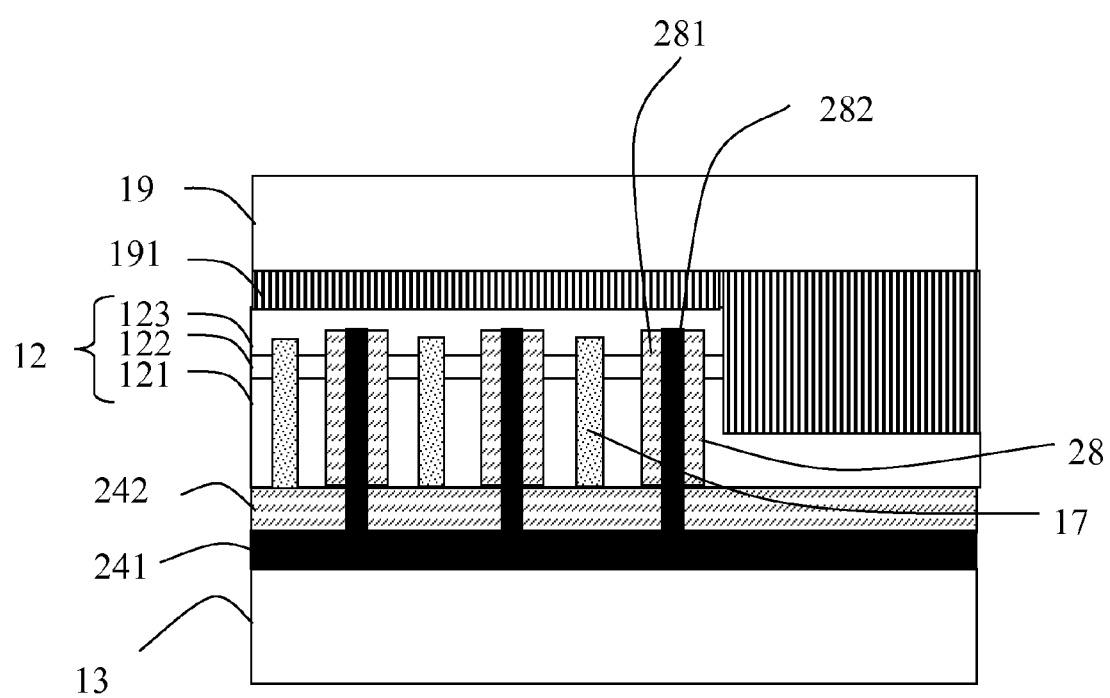
Figure 5I:
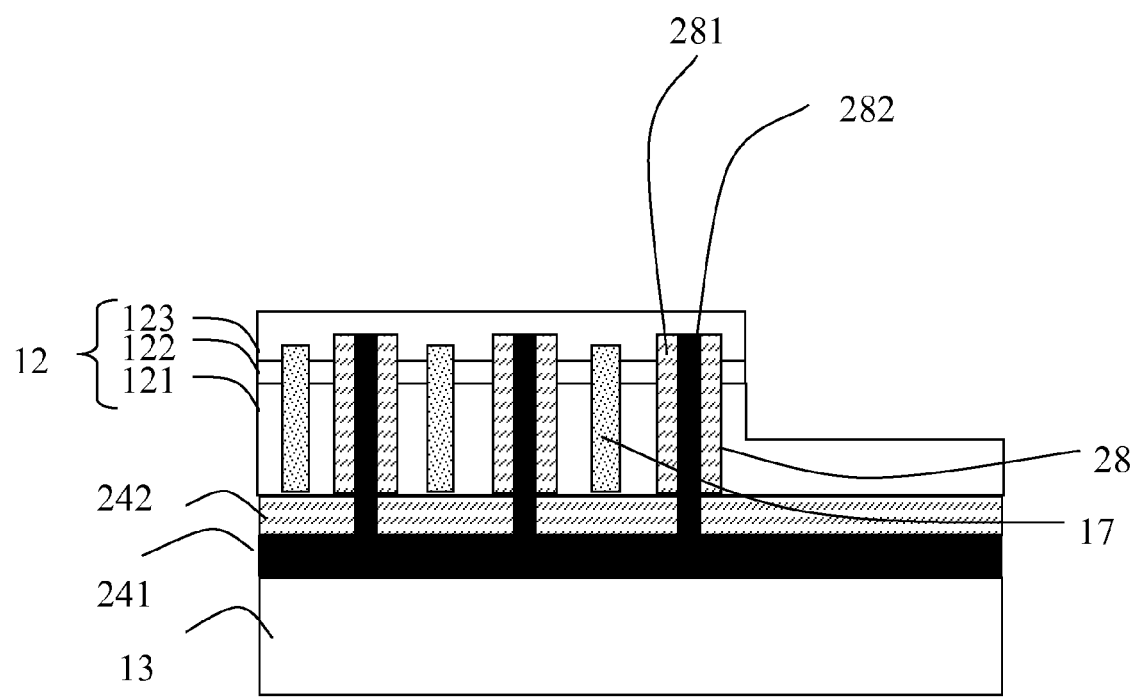
Figure 5J:
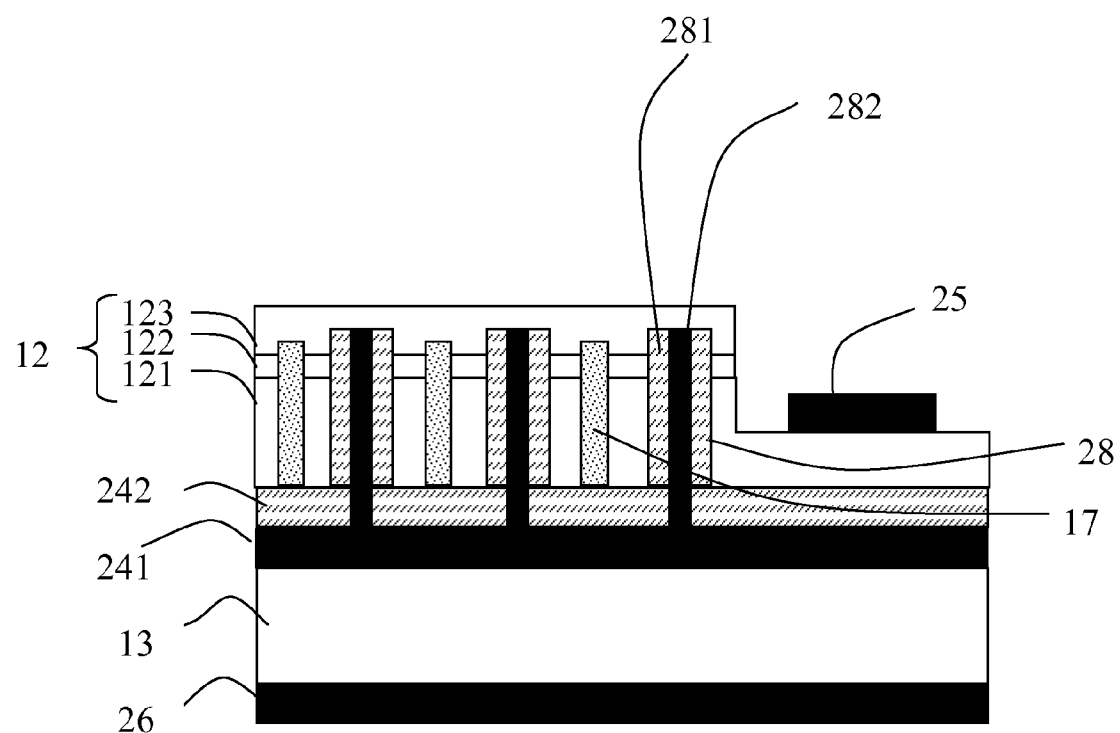

FIGS. 5A-5J show a method for forming the light-emitting device 2 illustrated in FIG. 2, and the method includes the following steps:
1. As shown in FIG. 5A, providing a growth substrate 11 first, and growing the semiconductor light-emitting structure 12 on the growth substrate in sequence comprising the first conductivity type semiconductor layer 121, an active layer 122, and a second conductivity type semiconductor layer 123, then removing part of the semiconductor light-emitting structure 12 by a lithography etching method and exposing a partial surface of the first conductivity type semiconductor layer 121.
2. As shown in FIG. 5B, thinning the growth substrate 11 by the chemical-mechanical polishing method to form the thinned substrate 111. Irradiating the lower surface S2 of the thinned substrate 111 by a laser beam to decompose the material of the semiconductor light-emitting structure 12 when absorbing the laser energy, and the decomposed material is removed by wet etching with HCl and KOH solution. The plurality of first channels 17 among the semiconductor light-emitting structure 12 is formed.
3. As shown in FIG. 5C, filling a transparent material or air in the first channels 17.
4. As shown in FIG. 5D, providing a support 19 attached to the surface of the second conductivity type semiconductor layer 123 and the exposed surface of the first conductivity type semiconductor layer 121 of the semiconductor light-emitting structure 12 by the paste, then removing the thinned substrate 111.
5. As shown in FIG. 5E, forming the insulating layer 242 on the lower surface of first conductivity type semiconductor layer 121, then dry etching or wet etching to form the second channels 28 that penetrating the insulating layer 242, first conductivity type semiconductor layer 121, active layer 122, and partial portion of the second conductivity type semiconductor layer 123 by using Inductively Coupled Plasma Reactive Ion Etching (ICPRIE) system.
6. As shown in FIG. 5F, forming the dielectric layer 281 on the inner sidewall of the second channels 28 by deposition method such as PECVD.
7. As shown in FIG. 5G, filling the conductive material in the second channels 28 to form the conductive layer 282.
8. As shown in FIG. 5H, providing the carrier 13 and forming the intermediate layer 241 on the carrier, then attaching the intermediate layer 241 and the carrier 13 to the insulating layer 242.
9. As shown in FIG. 5I, removing the adhesive layer 191 and the support 19.
10. As shown in FIG. 5J, forming the first wire pad 25 on the exposed first conductivity type semiconductor layer 121, and forming the second wire pad 26 on the lower surface of the carrier 13.

It should be noted that the proposed various embodiments are not for the purpose to limit the scope of the invention. Any possible modifications without departing from the spirit of the invention may be made and should be covered by the application.

We claim:

1. A semiconductor light-emitting device, comprising:
a base layer having a first surface and a second surface; and
a semiconductor light-emitting structure above the first surface of the base layer, comprising a plurality of semiconductor layers, a plurality of transparent channels, and a plurality of conductive channels not penetrating through an entirety of the plurality of semiconductor layers, wherein the conductive channels each comprises a conductive layer;
wherein the plurality of semiconductor layers comprises a first conductivity type semiconductor layer above the first surface of the base layer, an active layer above the first conductivity type semiconductor layer, and a second conductivity type semiconductor layer above the active layer;
wherein the first conductivity type semiconductor layer has an exposed portion not covered by the active layer, and a bonding pad is directly above the exposed portion of the first conductivity type semiconductor layer;
wherein the semiconductor light-emitting device is devoid of an insulating material between one of the conductive layers and the base layer and devoid of an insulating material in contact with the first surface of the base layer; and
wherein the plurality of transparent channels penetrates at least the first conductivity type semiconductor layer and the active layer.

2. The semiconductor light-emitting device according to claim 1, wherein the plurality of transparent channels comprises silicon oxide, silicon nitride, organic polymer, air, gallium nitride, silicon carbide, zinc oxide, or diamond.

3. The semiconductor light-emitting device according to claim 1, wherein the plurality of transparent channels comprises a transparent material having a refractive index different from that of the base layer, wherein a difference of the refractive index between the transparent material and the base layer is greater than 0.1.

4. The semiconductor light-emitting device according to claim 1, further comprising an intermediate layer between the semiconductor light emitting structure and the base layer.

5. The semiconductor light-emitting device according to claim 4, wherein the intermediate layer comprises an electricity connecting layer.

6. The semiconductor light-emitting device according to claim 5, wherein the semiconductor light-emitting device is devoid of an insulating material between the electricity connecting layer and the base layer.

7. The semiconductor light-emitting device according to claim 1, wherein the base layer comprises a conductive material.

8. The semiconductor light-emitting device according to claim 1, wherein the plurality of conductive channels comprises a dielectric layer surrounding a part of a periphery of the conductive layer.

9. The semiconductor light-emitting device according to claim 1, wherein the material of the conductive layers comprises metal, metal alloy, metal oxide, or conductive polymer.

10. The semiconductor light-emitting device according to claim 1, wherein the plurality of transparent channels has a diameter between 1 and 10 µm.

11. A semiconductor light-emitting device, comprising:
a carrier, wherein the carrier has a first surface and a second surface;
an intermediate layer above the first surface of the carrier;
an insulating layer above the intermediate layer;
a semiconductor light-emitting structure above the insulating layer and comprising a plurality of semiconductor layers, a plurality of conductive channels, each comprising a conductive layer, wherein the plurality of semiconductor layers comprises a first conductivity type semiconductor layer above the insulating layer, an active layer above the first conductivity type semiconductor layer, and a second conductivity type semiconductor layer above the active layer, and the first conductivity type semiconductor layer comprises a first exposed portion and a second exposed portion both not covered by the active layer;
an electricity connecting layer in the intermediate layer, wherein the electricity connecting layer is electrically connected with each conductive layer;
a bonding pad directly above the first exposed portion of the first conductivity type semiconductor layer; and
a second bonding pad above the second exposed portion and electrically connecting with the second conductivity type semiconductor layer through one of the conductive channels and the electricity connecting layer.

12. The semiconductor light-emitting device according to claim 11, wherein the semiconductor light-emitting structure further comprises a plurality of transparent channels having a predetermined depth penetrating through at least the first conductivity type semiconductor layer and the active layer.

13. The semiconductor light-emitting device according to claim 12, wherein the plurality of transparent channels has a diameter between 1 and 10 µm.

14. The semiconductor light-emitting device according to claim 12, wherein the plurality of transparent channels comprises silicon oxide, silicon nitride, organic polymer, air, silicon carbide, zinc oxide, or diamond.

15. The semiconductor light-emitting device according to claim 11, wherein one of the plurality of conductive channels has a predetermined depth penetrating through at least two layers of the plurality of semiconductor layers and extending to the insulating layer, and one of the plurality of conductive channels comprises a dielectric layer surrounding a part of a periphery of the conductive layer.

16. The semiconductor light-emitting device according to claim 11, wherein the semiconductor light-emitting structure further comprises a plurality of transparent channels not penetrating through the plurality of semiconductor layers.

17. The semiconductor light-emitting device according to claim 11, wherein the bonding pad is electrically connected with the first conductivity type semiconductor layer.

18. The semiconductor light-emitting device according to claim 11, wherein the semiconductor light-emitting device is devoid of an insulating material between the electricity connecting layer and the carrier.

19. The semiconductor light-emitting device according to claim 11, wherein the semiconductor light-emitting device is devoid of an insulating material between one of the conductive layers and the carrier, and wherein the carrier and the intermediate layer comprise different materials.

20. The semiconductor light-emitting device according to claim 11, wherein the material of the conductive layers comprises metal, metal alloy, metal oxide, or conductive polymer.

* * * * *